United States Patent [19]

Sakai et al.

[11] Patent Number: 4,699,825
[45] Date of Patent: Oct. 13, 1987

[54] METHOD OF FORMING SILICON NITRIDE FILM AND PRODUCT

[75] Inventors: Hideo Sakai, Kokubunji; Tetsuya Mizutani, Hamura; Takeo Yoshimi, Kokubunji, all of Japan

[73] Assignee: Hitachi, Ltd., Tokyo, Japan

[21] Appl. No.: 797,881

[22] Filed: Nov. 14, 1985

[30] Foreign Application Priority Data

Nov. 14, 1984 [JP] Japan .................. 59-238301

[51] Int. Cl.[4] .................... B32B 9/04; C23C 16/34
[52] U.S. Cl. ................................ 428/337; 427/94; 427/255; 427/255.2; 428/446; 437/241
[58] Field of Search ........... 427/255.2, 255, 94, 427/95; 428/446, 704, 337, 938, 64

[56] References Cited

U.S. PATENT DOCUMENTS

| | | | |
|---|---|---|---|
| 3,485,666 | 12/1969 | Sterling et al. | 427/255.2 |
| 3,540,926 | 11/1970 | Rairden | 427/255.2 |
| 3,637,423 | 1/1972 | Sestrich | 427/255.2 |
| 3,798,061 | 3/1974 | Yamazaki | 427/255.2 |
| 4,142,004 | 2/1979 | Hauser et al. | 427/255.2 |
| 4,279,947 | 7/1981 | Goldman et al. | 427/255.2 |
| 4,404,236 | 9/1983 | Komatsu et al. | 427/255 |

FOREIGN PATENT DOCUMENTS 54-155211  12/1979  Japan .................. 427/255.2

OTHER PUBLICATIONS

Ginsburgh et al, "Silicon Nitride Chem. Vapor Deposition in a Hot-Wall Diffusion System", J. Electrochem. Sci & Tech., vol. 125, No. 9, pp. 1557–1559, Sep. 1978.
Olcaytug et al, "A Low Temperature Process for the Reactive Formation of $Si_3N_4$ Layers on InSb", Thin Solid Films, vol. 67, pp. 321–324, 1980.

Primary Examiner—Sadie L. Childs
Attorney, Agent, or Firm—Antonelli, Terry & Wands

[57] ABSTRACT

In forming a silicon nitride film by the low-pressure CVD method using a silane gas and ammonia, the reaction pressure is set to lie over a range of from about 0.05 to about 0.25 Torr, enabling a silicon nitride film to be formed, of uniform thickness, highly efficiently even on large wafers, and maintaining high yield, improved uniformity and good quality as a whole without decreasing the film-forming efficiency. Preferably, the reaction pressure is maintained over a range of from 0.1 to 0.2 Torr to further increase the efficiency, while preferably maintaining the temperature over a range of from 700° to 1000° C.

14 Claims, 5 Drawing Figures

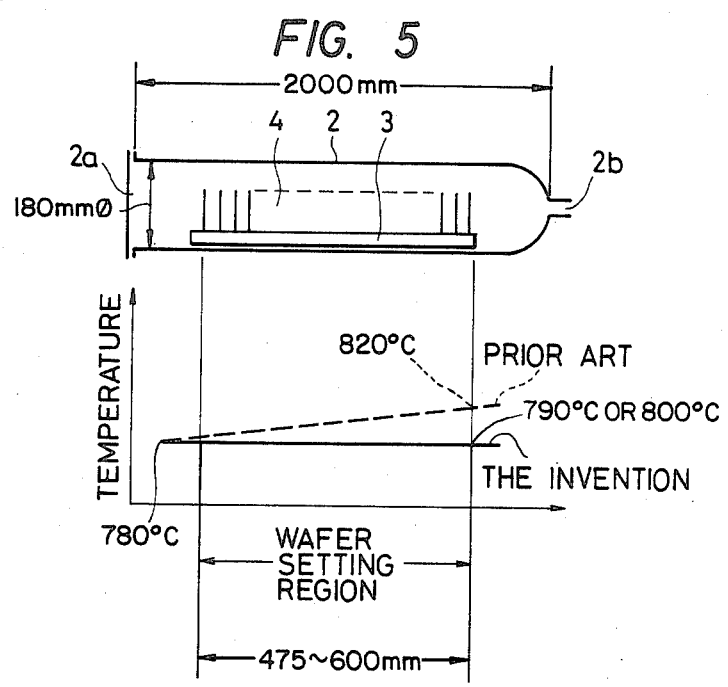

METHOD OF FORMING SILICON NITRIDE FILM AND PRODUCT

BACKGROUND OF THE INVENTION

The present invention relates to a method of forming silicon nitride film, and particularly to a method of forming silicon nitride film by a low-pressure CVD method maintaining a high film-forming efficiency.

The silicon nitride film ($Si_3N_4$) is used for semiconductor devices to form, for example, a mask for selectively oxidizing silicon, to form a surface protection film and to form a memory in formed MNOS (Metal Nitride Oxide Semiconductor) structure. The silicon nitride film is, usually, formed by the CVD (chemical vapor deposition) method using a silane-type gas and ammonia. Preferably, however, a so-called CVD method is employed in which the pressure during the reacting is maintained lower than the normal pressure (one atmosphere=760 Torr). Namely, mean free paths and diffusion constants of the reaction gas and carrier gas increase with the decrease in the pressure. Therefore, thickness of the silicon nitride film formed on the surface of the wafer and film characteristics such as reflection factor and the like are distributed more uniformly at reduced pressure than at normal pressure. Further, as the mean free path and the diffusion constant increase, films are uniformly formed on a number of wafers that are vertically arranged in the reaction furnace, minimizing variance in the quality of films among the wafers, thereby increasing processing capacity since a large number of wafers are processed simultaneously.

U.S. Pat. No. 4,279,947, the contents of which are incorporated herein, discloses a method of depositing a silicon nitride film on a wafer by the low-pressure CVD method, in which the temperature in the reaction furnace is maintained at about 650° C. to about 1000° C., and a silane gas reacts with ammonia in the reaction furnace under a pressure of about 0.3 to about 10 Torr to obtain good results.

The inventors of the present invention have conducted experiments extensively relying upon the above-mentioned data and have obtained the results as described below. In such experiments, the wafers had a uniform spacing between adjacent (opposed) surfaces of adjacent wafers throughout the total number of wafers, with such spacing being 5 mm. That is, 100 silicon wafers having a diameter of about 75 mm (about three inches) were simultaneously treated under the above-mentioned conditions (about 750° C., 0.3 Torr) to obtain silicon nitride films that were nearly 100% satisfactory (that is, nearly 100% of the films did not vary in thickness by more than 5% over the entire wafer). However, when silicon wafers having larger diameters, i.e., having diameters of 100 mm, 125 mm, and 150 mm were treated, nonuniform portions developed in the films, and the number of wafers that were satisfactory (i.e., did not vary in thickness over the entire wafer by more than 5%) decreased to 95, 75, and 50. Namely, as the diameter of the silicon wafers increases, satisfactory results are not necessarily obtained under the above-mentioned conditions. The recent trend toward production of large wafers makes it necessary to modify the low-pressure CVD method.

SUMMARY OF THE INVENTION

The object of the present invention is to provide a method of forming silicon nitride film by a low-pressure CVD system, in order to form silicon nitride films of good quality even on the wafers having diameters of greater than 100 mm without decreasing the film-forming ability or film-forming efficiency.

A further object of the present invention is to provide a method of forming silicon nitride film by a low-pressure CVD system, in order to provide silicon nitride films of relatively uniform thickness even on wafers having diameters of greater than 100 mm without decreasing the film-forming ability or film-forming efficiency.

A still further object of the present invention is to provide a method of forming silicon nitride film by a low-pressure CVD system, on wafers positioned in a reaction chamber, in a wafer setting region thereof (with the wafers being parallel to each other and being positioned such that flow of the reacting substances is at least about perpendicular to the broad surfaces of the wafers), in order to provide silicon nitride films of relatively uniform thickness even on wafers having diameters of greater than 100 mm.

The above and other objects as well as novel features of the present invention will become obvious from the description of the specification and the accompanying drawings.

A representative example of the invention disclosed herein will be described below briefly. As can be appreciated, the present invention is not to be limited thereto. Namely, in forming a silicon nitride film by the low-pressure CVD method using silane gas (e.g., $SiH_2Cl_2$, $SiH_3Cl$, $SiCl_4$, $SiH_4$, $Si_2H_6$ and $Si_3H_7$, etc.) and ammonia, and using temperatures in the reaction furnace as described above (that is, 650°-100° C.), the reaction pressure is set to lie over a range of from about 0.05 to about 0.25 Torr, enabling a silicon nitride film to be formed highly efficiently even on wafers having large diameters, maintaining high yields, improved uniformity and good quality as a whole, without decreasing the film-forming efficiency.

The wafers can be provided in a reaction chamber, in a wafer setting region thereof, the wafers being parallel to each other and being positioned such that flow of the reacting substances is at least about perpendicular to the broad surfaces of the wafers. By "at least about perpendicular" is meant that the wafers need not be exactly perpendicular to the direction of flow of the reacting substances (i.e., can be inclined at a slight angle) but can be perpendicular. Thus, where a horizontally disposed reaction tube is used, the wafers can be disposed at least about vertically therein, with their broad surfaces at least about perpendicular to the axis of the reaction tube. In such chamber, as an example adjacent (opposed) surfaces of adjacent wafers can be uniformly spaced throughout the entire wafer setting region, for example, at a spacing of at least 4.75 mm (e.g., for the three different sizes of 100 mm, 125 mm, and 150 mm, a spacing of at least 4.75 mm, 5 mm and 6 mm, respectively).

Preferably, the reaction pressure is maintained over a range of from 0.1 to 0.2 Torr to further increase the efficiency, while maintaining the temperature over a range of from 700°0 to 1000° C.

The inventors have formed silicon nitride films on three kinds of wafers having different diameters, i.e., having diameters of 100 mm, 125 mm, and 150 mm, by the low-pressure CVD method under different pressure conditions, in order to examine the number of acceptable products (acceptable ratio), and have discovered the tendency shown in FIG. 1. Wafers were treated in a batch of 100 using dichlorosilane (SiH$_2$Cl$_2$) and ammonia (NH$_3$) to form the silicon nitride film. The wafers were held in the wafer setting region of a reaction chamber with a spacing between adjacent surfaces of adjacent wafers of 5 mm, with the reaction temperature in the wafer setting region being 780°–800° C. during the low-pressure CVD method. It was found that if the reaction pressure was reduced to 0.25 Torr or smaller, the number of acceptable wafers increased; i.e., the number of acceptable wafers (that is, the number of wafers wherein the thickness of the deposited film did not vary by more than 5% over the entire wafer) reached 100 irrespective of the diameter of wafers. This is attributed to the fact that as the mean free path and the diffusion constant increase with the decrease in the pressure, the reaction gas is permitted to easily infiltrate even into tiny cavities in large wafers, making it possible to form the film uniformly. As the pressure decreases, furthermore, the number of acceptable wafers may exceed 100 as indicated by the broken lines in FIG. 1.

The inventors have further discovered the fact that the speed for depositing the silicon nitride film decreased with the decrease in the pressure as shown in FIG. 2. Therefore, if the deposition speed (A/min) represented by the ordinate is denoted by x, the thickness of the formed silicon nitride film by c, and the time required for evacuating the furnace and the like by b, then the time t required for forming the films of on time is given by the following relation:

$$t = \frac{c}{x} + b$$

Here, the depositing speed x establishes a function of pressure as shown in FIG. 2. Therefore, the time t for forming the film of a required thickness establishes a relation which varies in inverse ratio to the pressure.

In the CVD method, therefore, decreasing the pressure helps increase the number of acceptable wafers but also increases the time for forming the films in a single process. Therefore, to simply reduce the pressure is not effective from the standpoint of film-forming ability (processability) and particularly from the standpoint of production efficiency in the semiconductor manufacturing factories.

The inventors therefore have studied the film-forming efficiency for the pressure as shown in FIG. 3, relying upon the product of the tendency of the number of acceptable wafers and the tendency of the treating time In this case, it is necessary to use different coefficients depending upon other factors such as temperature, kind of gas, shape and dimension of the furnace, and the like. It was found that with wafers of 100 to 150 mm in diameter, the efficiency accomplished by the existing method indicated by A in FIG. 3 could be exceeded if the pressure was maintained to lie from about 0.05 to about 0.25 Torr, though it varied slightly depending upon the diameter of the wafers. It was also clarified that the pressure range of 0.1 to 0.2 Torr was most favorable to obtain good efficiency for all of wafers measuring 100 to 150 mm in diameter.

The reaction temperature should also be modified to some extent with the decrease in pressure. According to the experiments, most favorable results were obtained over a temperature range of 700° to 1000° C. As indicated above, however, the temperature range can be, e.g., from 650°–1000° C. for practicing the present invention. As a silane gas, furthermore, use can be made of SiHCl$_3$, SiH$_3$Cl, SiH$_4$, SiCl$_4$ or the like, in addition to the aforementioned gas, to obtain satisfactory results within the above-mentioned pressure and temperature ranges.

BRIEF DESCRIPTION OF THE DRAWINGS

The aforementioned and other objects and novel features of the present invention will become apparent from the following description taken with reference to the accompanying drawings, in which:

FIG. 5 is a diagram of a temperature gradient in the reaction tube.

DESCRIPTION OF THE PREFERRED EMBODIMENTS

Embodiment 1

Figure 1:
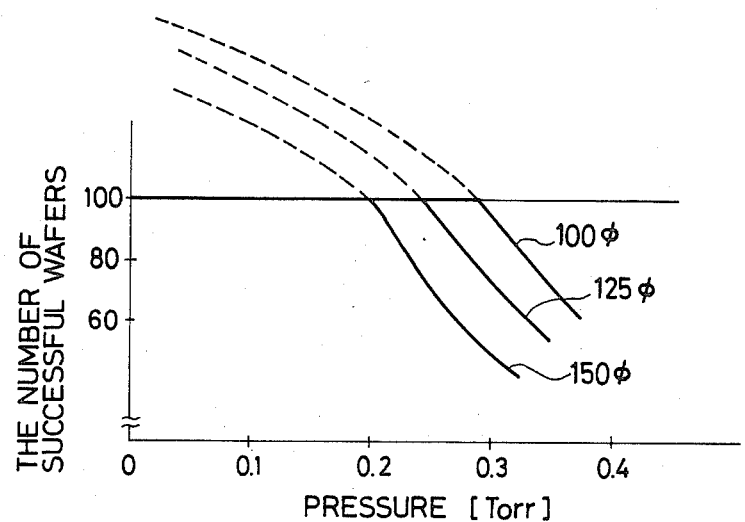
FIG. 1 is a graph showing a relation between the yield and the pressure.
Figure 2:
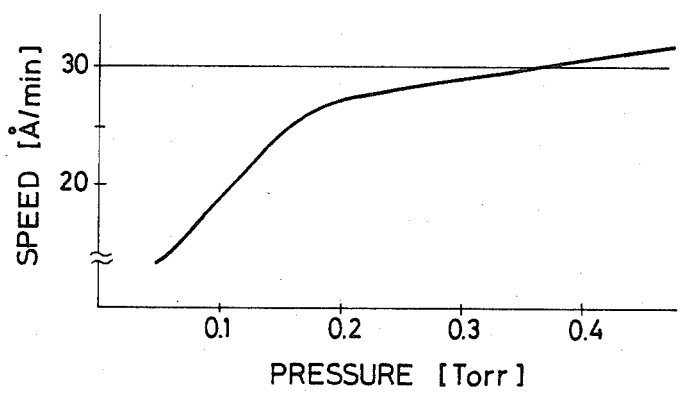
FIG. 2 is a graph showing a relation between the speed for forming films and the pressure.
Figure 3:
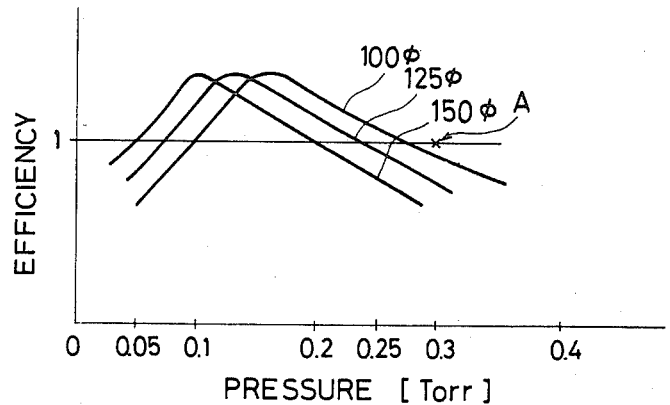
FIG. 3 is a graph showing a relation between the efficiency for forming films and the pressure.
Figure 4:
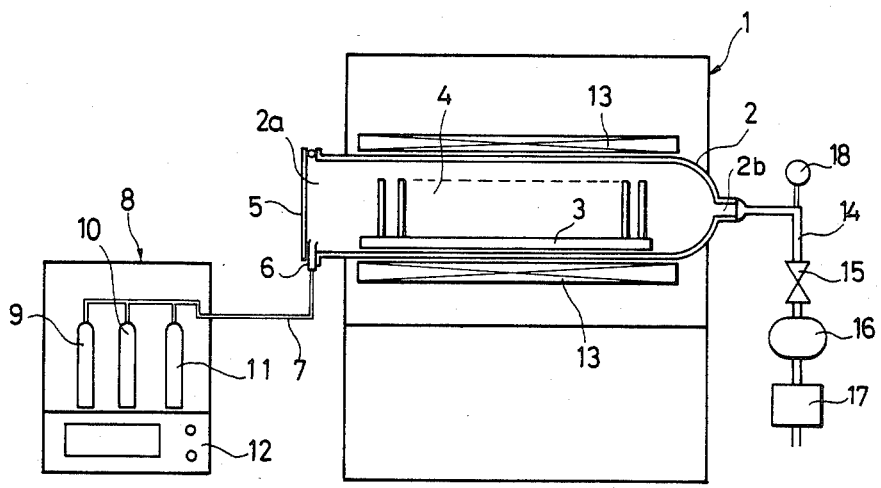
FIG. 4 is a diagram showing the structure of an apparatus for putting the invention into practice.

FIG. 4 shows an embodiment of the present invention. A reaction tube 2 made of quartz is laterally provided in a furnace 1. A number of silicon wafers 4 carried on a boat 3 are set into the reaction tube 2 through an opening 2a at one end of the reaction tube. The opening 2a at one end is provided with a cover 5 and a gas supply port 6 which is connected to a gas supply portion 8 via a tube 7. The gas supply portion 8 is provided with a silane gas source 9, an ammonia source 10 and a carrier gas source 11, the supply rates of which are controlled by a control portion 12. As seen in FIG. 4, the wafers are positioned in the reaction tube such that the wafers are parallel to each other, with the broad surfaces of the wafers being perpendicular to the direction of gas flow (e.g., from gas supply port 6 to opening 2b) and, in this embodiment, perpendicular to the axis of the reaction tube. Thus, in the present embodiment, where the reaction tube is laterally provided in the furnace, the wafers are positioned vertically.

A heater 13 is arranged around the reaction tube 2 to freely control the temperature distribution in the reaction tube 2. Usually, a temperature gradient is imparted such that the temperature is higher on the side of an opening 2b than in the opening 2a at one end as shown in FIG. 5.

Further, exemplary dimensions for the reaction tube are shown in FIG. 5. Thus, the reaction tube 2 shown in FIG. 5 has a length of 2000 mm and a diameter of 180 mm, with a wafer setting region ranging from 475 mm to 600 mm.

To the opening 2b at the other end of the reaction tube 2 is connected a vacuum tube 14 that is communicated with an air valve 15, a mechanical booster 16, and a rotary pump 17, to evacuate the interior of the reaction tube 2. Further, a pressure gauge 18 is provided at a portion of the vacuum tube 14 to measure the pressure in the reaction tube 2.

100 wafers each having a diameter of 125 mm carried on the boat 3 are set into the reaction tube 2 having a diameter of 180 mm, and the tube is sealed by the cover 5. The wafers were spaced to provide a spacing of 5 mm between adjacent surfaces of adjacent wafers. The reaction tube 2 is heated by the heater 13, so that the atmosphere surrounding the wafers 4 is heated maintaining a gradient as indicated by a solid line in FIG. 5 and that the central portion is heated at a temperature over a range of about 700° to about 1000° C. An $N_2$ gas is then supplied as a carrier gas from the gas supply port 8 into the reaction tube 2 through the gas supply port 6, and is discharged from the opening 2b at the other end to purge the interior thereof. Supply of the $N_2$ gas is then discontinued, and the rotary pump 17 is operated to reduce the pressure in the reaction tube 2 down to 0.01 Torr. Under this condition, the dichlorosilane gas and ammonia are supplied from the gas supply portion 8 into the reaction tube 2. The flow rate of the dichlorosilane gas is about 10 cc/min. and the flow rate of the ammonia is about 100 cc/min., and the pressure in the reaction tube 2 is maintained at 0.2 Torr while these gases are being supplied. The reaction is continued for about 60 minutes. Then, supply of the dichlorosilane gas and ammonia is stopped, the $N_2$ gas is permitted to flow into the reaction tube 2, and the wafers 4 are taken out from the reaction tube 2 together with the boat 3. A silicon nitride film is formed on the wafers 4 to a thickness of about 1000 Å; the silicon nitride film of all of 100 wafers satisfies a predetermined allowable value (that is, the film did not vary in thickness by more than 5% over the entire wafer).

According to this embodiment in which the reaction pressure is reduced to 0.2 Torr, the temperature gradient in the reaction tube 2 can be flattened compared with the temperature gradient in the existing reaction tubes indicated by a broken line in FIG. 5, making it easy to control the temperature with the heater 13. For example, note the temperature values as shown in FIG. 5.

Embodiment 2

Using the same apparatus as that of the above-mentioned embodiment, 100 silicon wafers each having a diameter of 150 mm are set into the reaction tube 2. After the $N_2$ gas is allowed to flow, the dichlorosilane gas and ammonia are supplied into the reaction tube 2 while maintaining the temperature over the range of 700° to 1000° C., and the reaction is carried out under the pressure of about 0.1 Torr. After the reaction has been carried out for about 60 minutes, the wafers are taken out in the same manner as described above. The silicon nitride film is formed to a thickness of about 1000 Å, and all 100 wafers satisfy the previously mentioned predetermined allowable value.

Effects of the invention are summarized below.

(1) The silicon nitride film is formed by the silane gas reacting with the ammonia at a pressure of about 0.05 to about 0.25 Torr. Therefore, the silicon nitride film can be uniformly formed even on large wafers, thereby increasing the yields and improving the efficiency (acceptable ratio) for forming the silicon nitride film without greatly increasing the time for treatment.

(2) The reaction carried out at a pressure preferably ranging from 0.1 to 0.2 Torr produces a silicon nitride film of good quality even on the wafers having diameters of 100 to 150 mm or larger, maintaining quite a high yield and efficiency.

(3) Since the reaction is carried out under the pressure of as low as from about 0.05 to about 0.25 Torr, the temperature gradient in the reaction tube can be made nearly uniform, so that it is easy to control the temperature.

(4) The reaction is carried out at a temperature over a range of 650° C., preferably 700° C., to 1000° C., and the existing reaction tube can be directly utilized.

In the foregoing was concretely described the invention accomplished by the inventors by way of embodiments. It should, however, be noted that the invention is in no way limited to the above embodiments only but can be modified in a variety of other ways without departing from the spirit and scope of the invention. For instance, the reaction gases may be those selected from the aforementioned gases in addition to the gases used in the embodiments or any other gases, and the reaction tube may be of the vertical type, barrel type or of any other type. Any pressure and temperature may be employed provided they fall within the above-mentioned ranges, and the same effects can be obtained by adjusting the temperature gradient and the reaction time.

In the foregoings was chiefly described the invention accomplished by the inventors with regard to forming a silicon nitride film on silicon wafers in the field of art that served as the background of the invention. However, the invention should in no way be limited thereto only but can further be adapted to forming a silicon nitride film onto any other semiconductor wafers and onto substrates other than those made of a semiconductor material.

While we have shown and described several embodiments in accordance with the present invention, it is understood that the same is not limited thereto but is susceptible of numerous changes and modifications as known to one having ordinary skill in the art and we therefore do not wish to be limited to the details shown and described herein, but intend to cover all such modifications as are encompassed by the scope of the appended claims.

what is claimed is:

1. A method of forming a silicon nitride film on a plurality of wafers positioned in a reaction chamber, said plurality of wafers being positioned parallel to each other and each of said plurality of wafers measuring equal to or greater than 100 mm in diameter, by a chemical vapor deposition process provided by reacting a silane gas with ammonia under a low pressure, wherein the reaction is carried out under a pressure ranging from about 0.05 to about 0.25 Torr and at a temperature ranging from 650° C. to 1000° C.

2. A method of forming a silicon nitride film according to claim 1, wherein the reaction is carried out under a pressure ranging from 0.1 to 0.2 Torr.

3. A method of forming a silicon nitride film according to claim 2, wherein the reaction is carried out at a temperature ranging from about 700° to 1000° C.

4. A method of forming a silicon nitride film according to claim 3, wherein the silicon nitride film is formed on wafers each measuring 100 to 150 mm in diameter.

5. A method of forming a silicon nitride film according to claim 4, wherein the wafers are silicon wafers.

6. A method of forming a silicon nitride film according to claim 1, wherein the silicon nitride film is formed on wafers each measuring 100 to 150 mm in diameter.

7. A method of forming a silicon nitride film according to claim 1, wherein the silane gas is selected from the group consisting of $SiH_3Cl$, $SiH_2Cl_2$, $SiHCl_3$, $SiCl_4$, $SiH_4$, $Si_2H_6$ and $Si_3H$.

8. A method of forming a silicon nitride film according to claim 1, wherein the silane gas and ammonia which react to form the silicon nitride film flow through said reaction chamber, with the plurality of wafers being positioned so as to be at least about perpendicular to the flow of the silane gas and ammonia through the reaction chamber.

9. A method of forming a silicon nitride film according to claim 8, wherein adjacent surfaces of adjacent wafers are spaced at least 4.75 mm.

10. A method of forming a silicon nitride film according to claim 9, wherein said plurality of wafers each measure 100 to 150 mm in diameter.

11. A method of forming a silicon nitride film according to claim 1, wherein adjacent surfaces of adjacent wafers are spaced at least 4.75 mm.

12. A method of forming a silicon nitride film according to claim 11, wherein said plurality of wafers each measure 100 to 150 mm in diameter.

13. Product formed by the process of claim 1.

14. Product formed by the process of claim 6.

* * * * *